United States Patent
Kim et al.

(10) Patent No.: US 7,288,436 B2
(45) Date of Patent: Oct. 30, 2007

(54) SEMICONDUCTOR CHIP PACKAGE MANUFACTURING METHOD INCLUDING SCREEN PRINTING PROCESS

(75) Inventors: Sang-Young Kim, Cheonan-si (KR); Gil-Beag Kim, Asan-si (KR); Yong-Jin Jung, Cheonan-si (KR); Jun-Soo Han, Cheonan-si (KR); Hyun-Ik Hwang, Asan-si (KR)

(73) Assignee: Samsung Electronics, Co., Ltd., Gyeonggi-Do (KR)

( * ) Notice: Subject to any disclaimer, the term of this patent is extended or adjusted under 35 U.S.C. 154(b) by 319 days.

(21) Appl. No.: 11/003,378

(22) Filed: Dec. 6, 2004

(65) Prior Publication Data
US 2005/0287708 A1  Dec. 29, 2005

(30) Foreign Application Priority Data
Jun. 24, 2004  (KR)  ............... 10-2004-0047594

(51) Int. Cl.
*H01L 21/50* (2006.01)
*H01L 21/48* (2006.01)
*H01L 21/44* (2006.01)
*H01L 23/52* (2006.01)
*H01L 23/48* (2006.01)
*H01L 21/20* (2006.01)

(52) U.S. Cl. ............... 438/118; 257/782; 257/783; 257/E21.122

(58) Field of Classification Search ............. 438/118; 257/782–783, E21.122
See application file for complete search history.

(56) References Cited

U.S. PATENT DOCUMENTS

| 5,811,879 | A | * | 9/1998 | Akram ............... 257/723 |
| 5,844,309 | A | * | 12/1998 | Takigawa et al. ........ 257/701 |
| 6,288,905 | B1 | * | 9/2001 | Chung ............... 361/771 |
| 2005/0008832 | A1 | * | 1/2005 | Santos et al. ............ 428/209 |

FOREIGN PATENT DOCUMENTS

| JP | 5-75247 A | 3/1993 |
| JP | 2001-24017 A | 1/2001 |
| JP | 2001-044607 A | 2/2001 |
| JP | 2001-068508 | 3/2001 |
| JP | 2001-156082 | 8/2001 |
| JP | 2002-137359 A | 5/2002 |

OTHER PUBLICATIONS

Korean Office Action dated Mar. 27, 2006.

* cited by examiner

*Primary Examiner*—Luan Thai
(74) *Attorney, Agent, or Firm*—Harness, Dickey & Pierce

(57) ABSTRACT

A method for manufacturing a semiconductor chip package may include screen printing an adhesive on a substrate using a screen printing mask. The adhesive may be heated during a first curing process. A semiconductor chip may be attached to the adhesive on the substrate. The adhesive may be heated during a second curing process. The physical property of the adhesive may be transformed before and after a screen printing process to improve the operational performance and/or quality of the adhesive.

12 Claims, 5 Drawing Sheets

SEMICONDUCTOR CHIP PACKAGE MANUFACTURING METHOD INCLUDING SCREEN PRINTING PROCESS

CROSS REFERENCE TO RELATED APPLICATIONS

This U.S. non-provisional application claims benefit of priority under 35 U.S.C. §119 of Korean Patent Application No. 2004-47594, filed on Jun. 24, 2004, the entire contents of which are incorporated herein by reference.

BACKGROUND OF THE INVENTION

1. Field of the Invention

The present invention relates generally to a method for manufacturing a semiconductor chip package and, more particularly, to a method for manufacturing a semiconductor chip package including a screen printing process.

2. Description of the Related Art

Semiconductor chips having integrated circuits may be provided as semiconductor chip packages for protection from the external environment, easy mounting and improved operational reliability. As package assembly techniques develop, semiconductor chip packages may move toward miniaturization. Various types of semiconductor chip packages have been introduced, some of which may be of a reduced size.

FIG. 1 is a cross-sectional view of a typical semiconductor chip package, for example a wire bonding ball grid array (WBGA) package.

Referring to FIG. 1, the semiconductor chip package 10 may include a semiconductor chip 11 and a substrate 15. The substrate 15 may have a window 18. The window 18 may be provided in the center of the substrate 15. The window 18 may penetrate through the substrate 15. The semiconductor chip 11 may be mounted on the substrate 15 by an adhesive 19, such that bonding pads 12 of the semiconductor chip 11 may be exposed through the window 18. The bonding pads 12 of the semiconductor chip 11 may be electrically connected to substrate pads 16 of the substrate 15 by bonding wires 21.

An encapsulant, including a first encapsulant 23 and a second encapsulant 25, may seal the semiconductor chip 11, the bonding wires 21 and a connection portion between the semiconductor chip 11 and the substrate 15. Ball lands 17 may be provided on the surface of the substrate 15. Solder balls 27 may be provided on the ball lands 17 as external connection terminals. The semiconductor chip 11 may be electrically connected to the solder balls 27 by the bonding wires 21, the substrate pads 16 and metal wirings (not shown). The solder balls 27 (and thus the semiconductor chip 11) may be electrically connected to an external substrate. The substrate 15 may include a tape wiring substrate, a printed circuit board, or have some other alternative form as is well known in this art.

Semiconductor chip packages, such as WBGA, FBGA and LOC packages for example, may have a semiconductor chip oriented such that the bonding pads may face toward and be exposed through the substrate. To manufacture such semiconductor chip packages it may be difficult to implement an epoxy dotting method in a die attaching process. Thus, some assembly techniques have been developed that employ a sheet type adhesive. However, sheet type adhesive may be relatively high-priced, which may increase the cost of manufacture. Recently, a screen printing method has been employed that may reduce the cost of manufacture.

In the screen printing method, a mask having through holes may be placed on a substrate and an adhesive may be squeezed (or pressed) into the through holes by a squeezing mechanism. As is well known in this art, the thickness and the shape of the adhesive may be adjustable.

FIG. 2 is a block diagram of a conventional method for manufacturing a semiconductor chip package.

Referring to FIG. 2, the conventional method for manufacturing a semiconductor chip package may involve a screen printing process 301, a die attaching process 302, and a curing 303 process. During the screen printing process 301, a thermosetting adhesive having a given viscosity may be applied on a substrate. During the die attaching process 302, a semiconductor chip may be provided on the adhesive. During the curing process 303, the thermosetting adhesive may be cured. Subsequently, a wire bonding process and a molding process may be performed.

Although the conventional method for manufacturing a semiconductor chip package may generally provide acceptable results, it is not without shortcomings. Some shortcomings may relate to the viscosity of the adhesive. On the one hand, if the viscosity of the adhesive is too high, the adhesive may have reduced printing capability and/or performance. For example, it may be difficult to press the adhesive through the mask. On the other hand, if the viscosity of the adhesive is too low, the adhesive may induce procedural faults. For example resin may bleed out (or flow to unintended areas of the substrate) after the screen printing process and/or resin may overflow during a die attaching process, thereby degrading the operational quality of the adhesive. The physical properties of the adhesive may influence operational quality and/or performance of the adhesive. An adhesive used in a screen printing process should have suitable viscosity in consideration of quality and/or performance. In practice, the conventional method for manufacturing a semiconductor chip package including a screen printing process may have limitations in meeting the demand for operational quality and/or performance of the adhesive.

The curing process 303 may involve loading a plurality of packages into an oven to cure the packages at the same time. Here, curing quality faults may occur due to the difference of temperature distribution according to the load quantity and position of the package within the oven.

The curing process 303 may be performed using an oven at low temperature over a long time period, thereby requiring a substantial amount of time. The die attaching process 302 may proceed using magazines, thereby costing significant production downtime. For the reasons set forth, the curing process 303 may not start promptly when the die attaching process 302 is completed. This may lead to a different point of time of cure for each material, thereby causing reduced reliability of a semiconductor chip package.

SUMMARY OF THE INVENTION

An exemplary embodiment of the present invention is directed to a method for manufacturing a semiconductor chip package that may include a screen printing process, which may have improved operational quality and/or performance of an adhesive used in the screen printing process.

Another exemplary embodiment of the present invention is directed to a method for manufacturing a semiconductor chip package that may include a screen printing process, which may prevent faulty cure which may result from the difference of temperature distribution according to the load quantity and position of packages during a curing process using an oven.

According to an example embodiment, the method may include screen printing an adhesive on a substrate, conducting a first curing process by applying heat to the adhesive, attaching a semiconductor chip to the adhesive, and conducting a second curing process by applying heat to the adhesive.

According to another example embodiment, the method may include (a) pressing an adhesive through a mask and onto a substrate, (b) heating the adhesive on the substrate, (c) attaching a semiconductor chip to the adhesive, and (d) heating the adhesive on the substrate. The features (b), (c), and (d) may be performed in sequence.

According to another example embodiment, the method may include mounting a semiconductor chip on a substrate via an adhesive, and heating the adhesive on the substrate to at least partially cure the adhesive both before and after the mounting.

BRIEF DESCRIPTION OF THE DRAWINGS

Exemplary embodiments of the present invention will be readily understood with reference to the following detailed description thereof provided in conjunction with the accompanying drawings, wherein like reference numerals designate like structural elements.

The drawings are provided for illustrative purposes only and are not drawn to scale. The spatial relationships and relative sizing of the illustrated elements may be reduced, expanded or rearranged to improve the clarity of the figures with respect to the corresponding description. The figures, therefore, may not accurately reflect the relative sizing or positioning of the corresponding structural elements that could be encompassed by an actual device manufactured according to the exemplary embodiments of the invention.

DETAILED DESCRIPTION OF THE EXEMPLARY EMBODIMENTS

Exemplary, non-limiting embodiments of the present invention will now be described more fully hereinafter with reference to the accompanying drawings. The invention may be embodied in many different forms and should not be construed as limited to the particular embodiments set forth herein. Rather, the exemplary embodiments are provided so that this disclosure will be thorough and complete, and will fully convey the scope of the invention to those skilled in the art. Well-known structures and processes have not been described or illustrated in detail to avoid obscuring the present invention. A layer may be considered as being formed (or otherwise provided) "on" another layer or a substrate when formed either directly on the referenced layer or the substrate or formed (or otherwise provided) on other layers or patterns overlaying the referenced layer or the substrate.

Figure 1:
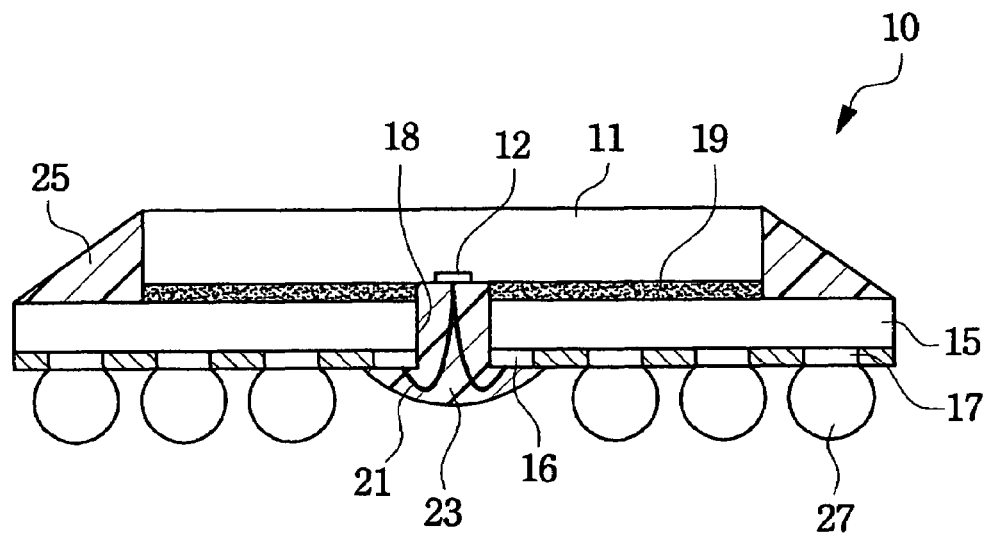
FIG. 1 is a cross-sectional view of one example of a typical semiconductor chip package.
Figure 2:
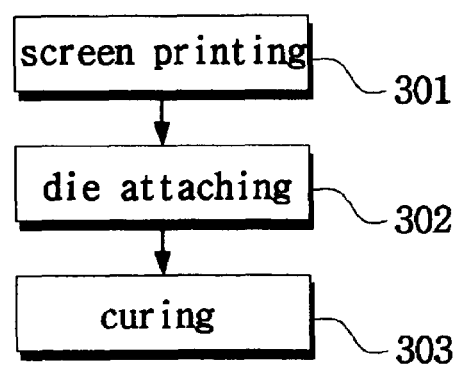
FIG. 2 is a block diagram of a conventional method for manufacturing a semiconductor chip package.
Figure 3:
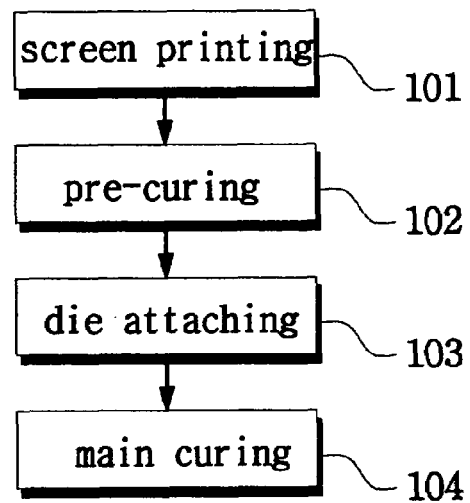
FIG. 3 is a block diagram of a method for manufacturing a semiconductor chip package in accordance with an exemplary embodiment of the present invention.

FIG. 3 is a block diagram of a method for manufacturing a semiconductor chip package in accordance with an exemplary embodiment of the present invention. FIGS. 4A through 4D are cross-sectional views of a method for manufacturing a semiconductor chip package in accordance with an exemplary embodiment of the present invention.

Referring to FIG. 3, the method for manufacturing a semiconductor chip package may include a screen printing process 101, a pre-curing process 102, a die attaching process 103, and a main curing process 104.

Figure 4A:
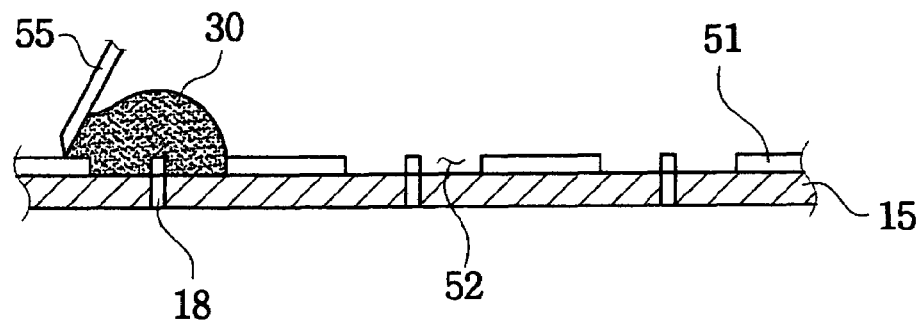
FIGS. 4A through 4D are cross-sectional views of a method for manufacturing a semiconductor chip package in accordance with an exemplary embodiment of the present invention.

Referring to FIG. 4A, the screen printing process 101 may be performed. Here, a screen printing mask 51 may be placed on a substrate 15. An adhesive 30 may be squeezed into through holes 52 of the screen printing mask 51 by a squeezing mechanism 55. The adhesive 30 may have a given viscosity having suitable printing capability. The viscosity of the adhesive 30 may be lower than that of a conventional adhesive. The adhesive 30 may include epoxy resin, elastomer, and/or other suitable materials as is well known in this art. By way of example only, and not as a limitation of the invention, the adhesive 30 may be thermosetting, which means that the adhesive 30 may be hardened via the application of heat. As shown, the mask 51 may cover the windows 18 provided in the substrate 15 to obstruct a flow of adhesive into the windows 18. Once the adhesive 30 has been applied and pressed through the mask 51, the mask 51 may be removed via techniques that are well known in this art.

Figure 4B:
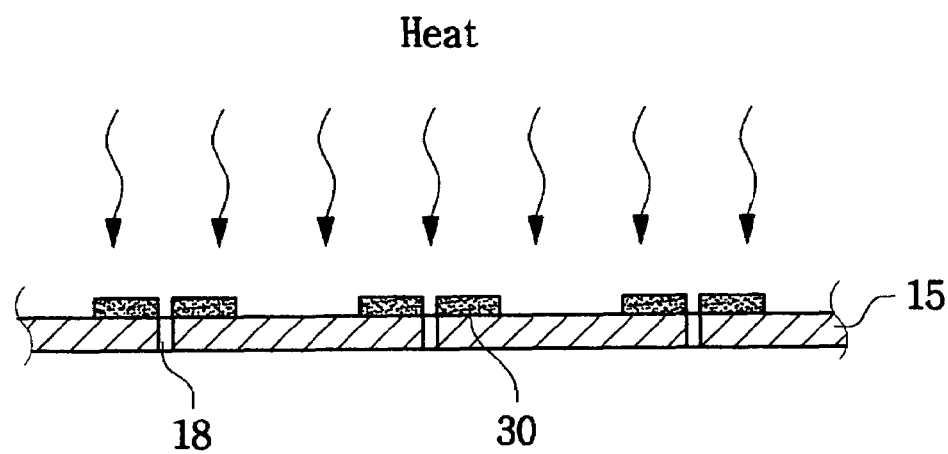

Referring to FIG. 4B, the pre-curing process 102 may be performed. Heat may be applied to the adhesive 30 to transform the physical property of the adhesive 30. The pre-curing process may increase the viscosity of the adhesive 30 by 20±5%. In the case of a liquid adhesive 30 being applied in the screen printing process, the pre-curing process may transform the liquid adhesive 30 to a gel type B-stage adhesive. In the case of a B-stage adhesive 30 being applied in the screen printing process, the pre-curing process may increase the viscosity of the B-stage adhesive 30.

The curing time and/or the temperature of the pre-curing process 102 may be varied depending on the nature, kind and/or property of the adhesive 30. For example, the pre-curing process 102 may proceed under a temperature between 100° C. and 200° C. and a time between 5 seconds and 5 minutes. In an example embodiment, the pre-curing temperature may be 150±10° C. and the pre-curing time may be 30±10 seconds.

The pre-curing process 102 may initiate immediately when the screen printing process 101 is completed. The pre-curing time may be less than a screen printing cycle time. For example, the screen printing cycle time may be 45 seconds, and the pre-curing time may be less than 45 seconds, e.g., approximately 30 seconds. The pre-curing process may proceed in conformity with delivery speed and quantity of packages in the screen printing process.

Figure 4C:
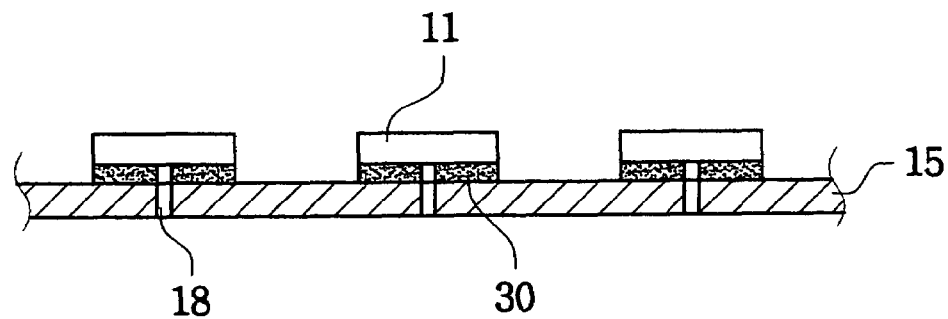

Referring to FIG. 4C, the die attaching process 103 may be performed. Here, a semiconductor chip 11 may be attached to the adhesive 30 of the substrate 15. Since the adhesive 30 may be formed to B-stage through the pre-curing process 102, there may be a reduced likelihood of faults occurring during the die attaching process 103, for example resin bleed out and/or overflow.

Figure 4D:
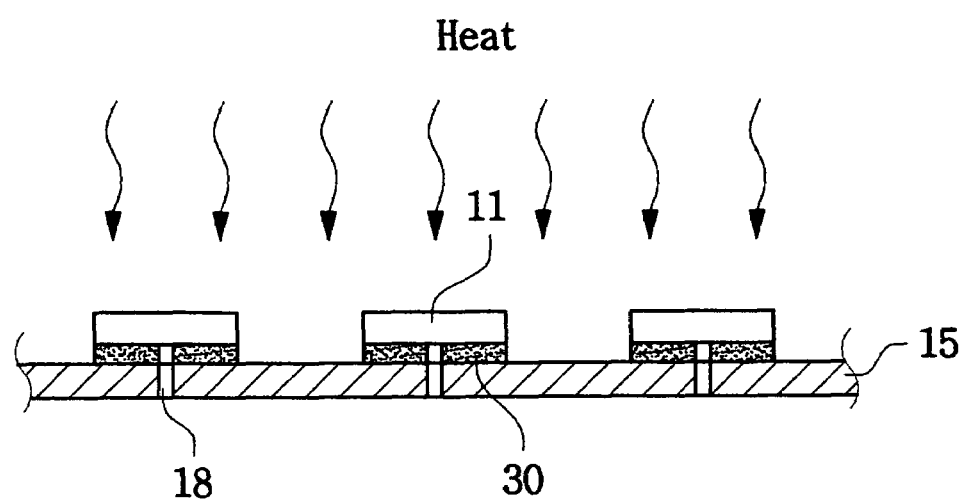

Referring to FIG. 4D, the main curing process 104 may be performed. Here, the adhesive 30 may be fully cured by the application of heat. A plurality of packages may be loaded into an oven and cured at the same time. Since the adhesive 30 may be preliminarily cured by the pre-curing process 102, it may be less susceptible to influences from the difference of temperature distribution depending on the load quantity and on the position of packages in the oven.

A wire bonding process and a molding process may be performed to complete the manufacture of a semiconductor chip package.

A method for manufacturing a semiconductor chip package including a screen printing process in accordance with an exemplary embodiment of the present invention may use an adhesive having good printing capability, thereby improving operational performance of the adhesive. The method may involve transforming the adhesive into B-stage through a pre-curing process, thereby reducing the likelihood of faults occurring during the die attaching and subsequent processes. Further, the method may involve preliminarily curing packages through the pre-curing process, thereby reducing influences which may be affected by the difference of temperature distribution depending on the load quantity and on the position of packages during a main curing process.

According to an exemplary embodiment of the present invention, a pre-curing apparatus may be installed in-line with a screen printing apparatus to allow the pre-curing process to continuously succeed the screen printing process.

C./30 sec., 140° C./20 sec. and 140° C./40 sec., a curing process (following the pre-curing process) may have on the average a lower curing maximum temperature than a conventional curing process without a pre-curing process. In this way, a pre-curing process may allow reduced curing start temperature and curing maximum temperature, thereby achieving a full cure more quickly than conventional methods.

Assuming that a heat capacitance of a conventional method for manufacturing a semiconductor chip package without a pre-curing process is 100%, a heat capacitance in accordance with exemplary embodiments of the present invention may be reduced to 97.65%, 89.77%, 94.30%, 88.30%, and 87.63% according to the curing condition. Note that as the heat capacitance is greater, the curing temperature and time may increase. A method for manufacturing a semiconductor chip package according to exemplary embodiments of the present invention may have reduced curing temperature and time at a main curing process.

In view of the results above, a method for manufacturing a semiconductor chip package according to example embodiments of the present invention may have a lower curing start temperature, a lower curing maximum temperature, and reduced heat capacitance, thereby achieving reduced curing time and improved curing quality as compared to conventional methods.

Accordingly, a method for manufacturing a semiconductor chip package in accordance with an exemplary embodiment of the present invention may transform the physical

TABLE 1

|  | Convention | 120° C./20 sec. | 120° C./40 sec. | 130° C./30 sec. | 140° C./20 sec. | 140° C./40 sec. |
|---|---|---|---|---|---|---|
| Ti | 135.294 | 135.510 | 128.354 | 130.145 | 134.106 | 130.413 |
| Tp | 152.668 | 151.015 | 148.182 | 152.340 | 153.332 | 149.509 |
| ΔH | 9.403 | 9.182 | 8.441 | 8.866 | 8.303 | 8.240 |
| (J/g) | 100% | 97.65% | 89.77% | 94.30% | 88.30% | 87.63% |

Figure 5:
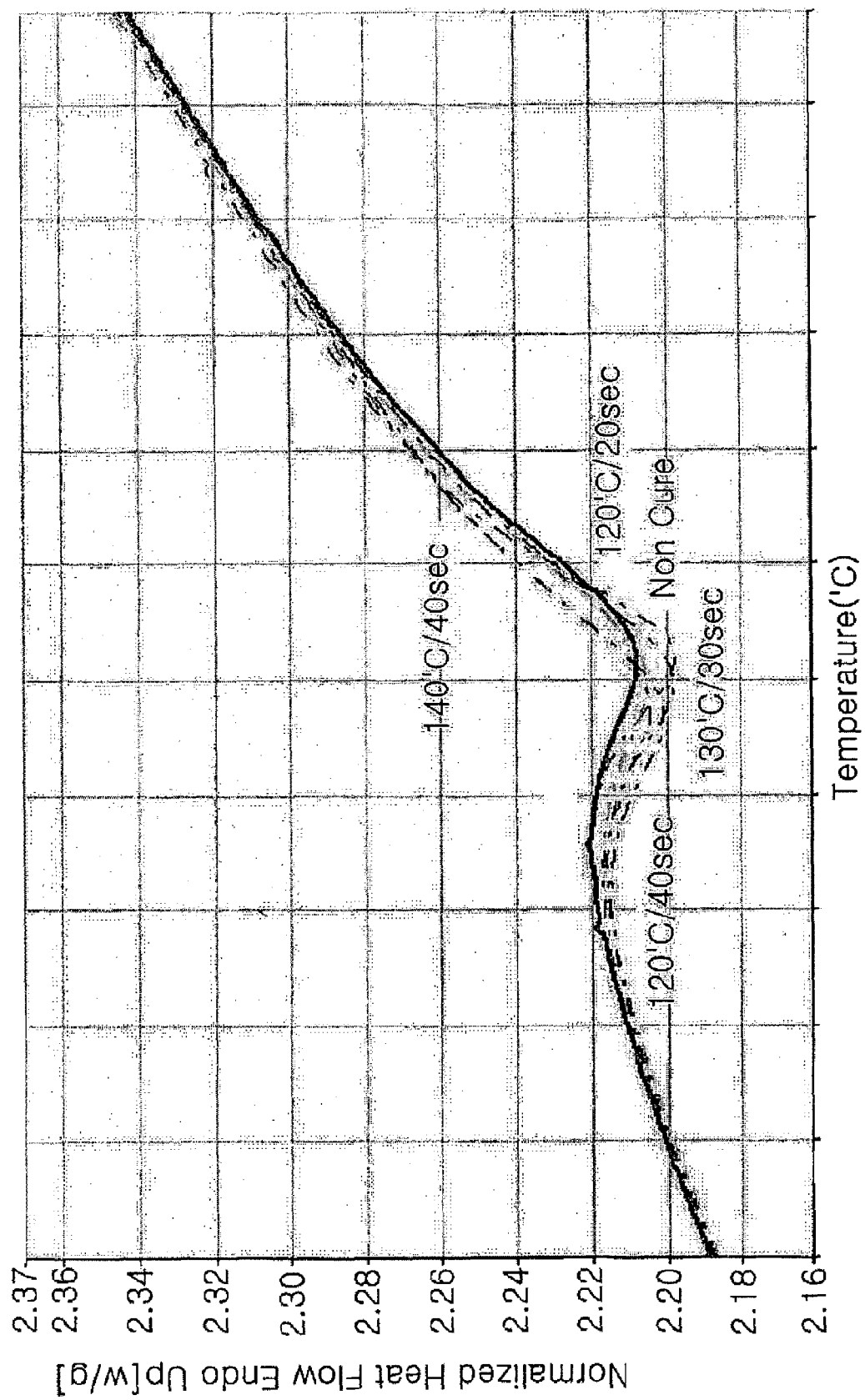
FIG. 5 is a graph illustrating the relationship between heat capacitance and temperature at a main curing process of a method for manufacturing a semiconductor chip package in accordance with an exemplary embodiment of the present invention.

Table 1 illustrates thermal effects according to curing temperature/time during a main curing process (i.e., after a pre-curing process is performed) in accordance with an example embodiment of the present invention, in comparison to a curing process of a conventional method for manufacturing a semiconductor chip package. FIG. 5 is a graphic view illustrating the relationship of heat capacitance and temperature during a main curing process of a method for manufacturing a semiconductor chip package in accordance with an exemplary embodiment of the present invention.

In Table 1, Ti is a curing start temperature. Tp is a curing maximum temperature. ΔH is a heat capacitance. "Convention" indicates the curing process of a conventional method for manufacturing a semiconductor chip package (i.e., without a pre-curing process).

The test results show that a conventional method for manufacturing a semiconductor chip package may have a curing start temperature of 135.294° C., a curing maximum temperature of 152.668° C. and heat capacitance of 9.403 J/g. When a pre-curing process proceeds on conditions of 120° C./20 sec., 120° C./40 sec., 130° C./30 sec., 140° C./20 sec. and 140° C./40 sec., a curing process (following the pre-curing process) may have on the average a lower curing start temperature than the conventional curing process without a pre-curing process. When a pre-curing process proceeds on conditions of 120° C./20 sec., 120° C./40 sec., 130° property of an adhesive before and after a screen printing process to improve the operational performance and/or quality of the adhesive. Further, the method may reduce the chances of faulty curing which may result from the downtime for a main curing process, or from the difference of temperature distribution according to the load quantity and position of packages in an oven during the main curing process. Therefore, reliability and productivity of semiconductor chip packages may be improved.

Although exemplary, non-limiting embodiments of the present invention have been described in detail hereinabove, it should be understood that many variations and/or modifications of the basic inventive concepts herein taught, which may appear to those skilled in the art, will still fall within the spirit and scope of the exemplary embodiments of the present invention as defined in the appended claims.

What is claimed is:

1. A method for manufacturing a semiconductor chip package, the method comprising:
    providing a substrate having at least one window;
    screen printing an adhesive on a-the substrate through a screen printing mask, the adhesive being formed in a pattern having an opening exposing the at least one window;
    conducting a first curing process by applying heat to the adhesive;

attaching at least one semiconductor chip to the adhesive, the at least one semiconductor chip having at least one bonding pad exposed through the at least one window; and conducting a second curing process by applying heat to the adhesive, wherein the screen printing, the first curing process, the attaching, and the second curing process are performed in sequential order.

2. The method of claim 1, wherein the adhesive is a liquid adhesive, and the first curing process includes gelling the liquid adhesive.

3. The method of claim 2, wherein the first curing process proceeds under a temperature between 100° C. and 200° C. and for a time between 5 seconds and 5 minutes.

4. The method of claim 3, wherein the temperature is 150±10° C. and the time is 30±10 seconds.

5. The method of claim 1, wherein the adhesive is a gel adhesive, and the first curing process increases the viscosity of the gel adhesive.

6. The method of claim 1, wherein the first curing process proceeds under a temperature between 100° C. and 200° C. and for a time between 5 seconds and 5 minutes.

7. The method of claim 6, wherein the temperature is 150±10° C. and the time is 30±10 seconds.

8. The method of claim 1, wherein the adhesive is a thermosetting adhesive.

9. A method for manufacturing a semiconductor chip package, the method comprising:
   (a) providing a substrate having at least one window;
   (b) pressing an adhesive through a screen printing mask and onto the substrate, the adhesive being formed in a pattern having an opening exposing the at least one window;
   (c) heating the adhesive on the substrate;
   (d) attaching at least one semiconductor chip to the adhesive, the at least one semiconductor chip having at least one bonding pad exposed through the at least one window; and
   (e) heating the adhesive on the substrate;
   wherein (c), (d), and (e) are performed in sequence.

10. The method of claim 9, wherein the adhesive is thermosetting adhesive.

11. The method of claim 10, wherein the heating of (e) transforms the thermosetting adhesive to a B-stage.

12. The method of claim 8, wherein the first curing process transforms the thermosetting adhesive to a B-stage.

* * * * *